US012772605B2

(12) United States Patent
Dupre et al.

(10) Patent No.: US 12,772,605 B2
(45) Date of Patent: Oct. 20, 2026

(54) METHOD OF MANUFACTURING AN ELECTRONIC DEVICE COMPRISING ELECTROPOLISHING

(71) Applicant: Commissariat à l'Énergie Atomique et aux Énergies Alternatives, Paris (FR)

(72) Inventors: Ludovic Dupre, Grenoble Cedex (FR); Carole Pernel, Grenoble Cedex (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 294 days.

(21) Appl. No.: 18/537,470

(22) Filed: Dec. 12, 2023

(65) Prior Publication Data

US 2024/0204130 A1 Jun. 20, 2024

(30) Foreign Application Priority Data

Dec. 19, 2022 (FR) ...................................... 2213826

(51) Int. Cl.
*H10H 20/01* (2025.01)

(52) U.S. Cl.
CPC ........ *H10H 20/018* (2025.01); *H10H 20/013* (2025.01); *H10H 20/032* (2025.01)

(58) Field of Classification Search
None
See application file for complete search history.

(56) References Cited

U.S. PATENT DOCUMENTS

| | | | | |
|---|---|---|---|---|
| 8,252,662 | B1 | 8/2012 | Poblenz et al. | |
| 2014/0306254 | A1 | 10/2014 | Song | |
| 2016/0130717 | A1* | 5/2016 | Ye | C25F 5/00 428/188 |
| 2017/0236807 | A1* | 8/2017 | Hwang | H10H 20/0137 257/90 |
| 2017/0288087 | A1* | 10/2017 | Schubert | H10H 20/01335 |
| 2021/0050476 | A1* | 2/2021 | Benaissa | H10H 20/01 |
| 2021/0193873 | A1* | 6/2021 | Pernel | H10H 20/8252 |
| 2022/0320367 | A1* | 10/2022 | Robin | H10H 20/812 |

OTHER PUBLICATIONS

Preliminary Search Report for French Application No. 2213826, dated Jul. 5, 2023.
Villa et al., A substrate removal processing method for III-V solar cells compatible with low-temperature characterization. Materials Science in Semiconductor Processing. Jun. 1, 2017;63:58-63.

(Continued)

*Primary Examiner* — Nduka E Ojeh
(74) *Attorney, Agent, or Firm* — Wolf, Greenfield & Sacks, P.C.

(57) ABSTRACT

A method of manufacturing an electronic device comprising the following successive steps: a) forming a structure comprising a diode stack disposed on a first substrate, and a sacrificial layer of semiconductor material interposed between the first substrate and the diode stack; b) transferring the structure to a second substrate; and c) removing the first substrate by electropolishing the sacrificial layer by applying a bias voltage to the sacrificial layer via the diode stack.

17 Claims, 6 Drawing Sheets

(56) References Cited

OTHER PUBLICATIONS

Reiner et al., Si-substrate removal for AlGaN/GaN devices on PCB carriers. Proceedings of the 2020 32nd International Symposium on Power Semiconductor Devices and ICs (ISPSD) Sep. 13, 2020:286-9.

Zhang et al., Preparation of GaN-on-Si based thin-film flip-chip LEDs. Journal of Semiconductors. May 1, 2013;34(5):053006.

Alarcón-Lladó et al., Temperature rise in InGaN/GaN vertical light emitting diode on copper transferred from silicon probed by Raman scattering. Journal of Applied Physics. Dec. 1, 2010;108(11):114501.

* cited by examiner

METHOD OF MANUFACTURING AN ELECTRONIC DEVICE COMPRISING ELECTROPOLISHING

CROSS REFERENCE TO RELATED APPLICATIONS

This application claims priority to French application number 2213826, filed Dec. 19, 2022, the contents of which is incorporated herein by reference in its entirety.

TECHNICAL FIELD

The present description relates generally to electronic devices. More particularly, the present description relates to methods for manufacturing electronic devices comprising a step of removing a substrate on which a diode stack has previously been formed.

BACKGROUND ART

Methods for manufacturing devices comprising a step of removing a substrate on which a diode stack has previously been formed have been proposed. In existing methods, wet etching, for example using a mixture of hydrofluoric acid and nitric acid, dry etching, for example using a sulfur hexafluoride-based plasma, or laser removal techniques are particularly performed to remove the substrate.

However, these methods suffer from various drawbacks. In particular, once the substrate has been removed, existing methods require complex steps of removing buffer layers so that the active layer(s) of the diode stack are exposed.

SUMMARY OF INVENTION

The purpose of one embodiment is to address some or all of the drawbacks of known methods for manufacturing electronic devices comprising a step of removing a substrate on which a diode stack has previously been formed.

To this end, one embodiment provides a method of manufacturing an electronic device comprising the following successive steps:

a) forming a structure comprising a diode stack disposed on a first substrate and a sacrificial layer of semiconductor material interposed between the first substrate and the diode stack;

b) transferring the structure onto a second substrate; and c) removing the first substrate by electropolishing the sacrificial layer by applying a bias voltage to the sacrificial layer via the diode stack.

According to one embodiment, in step b), transferring is performed by conductive molecular bonding on the side of a first face of the diode stack opposite the first substrate.

According to one embodiment, in step c), the structure is immersed in an electrolyte.

According to one embodiment, in step c), the bias voltage is applied between a first electrode connected to a conductive layer on the second substrate and a second electrode immersed in the electrolyte.

According to one embodiment, the conductive layer coats the second substrate.

According to one embodiment, an insulating layer in which contact pick-up elements are formed is interposed between the second substrate and the conductive layer.

According to one embodiment, the method further comprises, subsequent to step c), a step of etching the diode stack so that an elementary diode is formed vertically in line with each contact pick-up element.

According to one embodiment, in step a), the first substrate is a full wafer with a maximum lateral dimension strictly smaller than that of the second substrate.

According to one embodiment, the method further comprises, between steps b) and c), a step of forming hollow vias extending from a face of the first substrate opposite the diode stack to the diode stack and passing through the sacrificial layer.

According to one embodiment, the diode stack comprises:

- a first doped layer of a first conductivity type coating the sacrificial layer;
- an active layer coating the first layer; and
- a second doped layer of a second conductivity type, opposite the first conductivity type, coating the active layer.

According to one embodiment, the sacrificial layer is doped with the first type of conductivity.

According to one embodiment, the first layer has a doping level strictly lower, for example at least ten times lower, preferably at least a thousand times lower, than that of the sacrificial layer.

According to one embodiment, the sacrificial layer is made of a III-V semiconductor material.

According to one embodiment, the sacrificial layer is made of gallium nitride.

According to one embodiment, the diode stack is an inorganic light-emitting diode stack.

BRIEF DESCRIPTION OF DRAWINGS

The foregoing features and advantages, as well as others, will be described in detail in the following description of specific embodiments given by way of illustration and not limitation with reference to the accompanying drawings, in which.

DESCRIPTION OF EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the construction of diodes and their control circuits has not been detailed, as the construction of such diodes and circuits is within the scope of those skilled in the art from the indications of the present description.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms “front”, “back”, “top”, “bottom”, “left”, “right”, etc., or to relative positional qualifiers, such as the terms “above”, “below”, “higher”, “lower”, etc., or to qualifiers of orientation, such as “horizontal”, “vertical”, etc., reference is made to the orientation shown in the figures.

Unless specified otherwise, the expressions “around”, “approximately”, “substantially” and “in the order of” signify within 10%, and preferably within 5%.

FIG. 1A, FIG. 1B, FIG. 1C, FIG. 1D, and FIG. 1E are schematic, partial cross-sectional views illustrating successive steps in an example method for manufacturing an electronic device according to one embodiment.

Figure 1A:
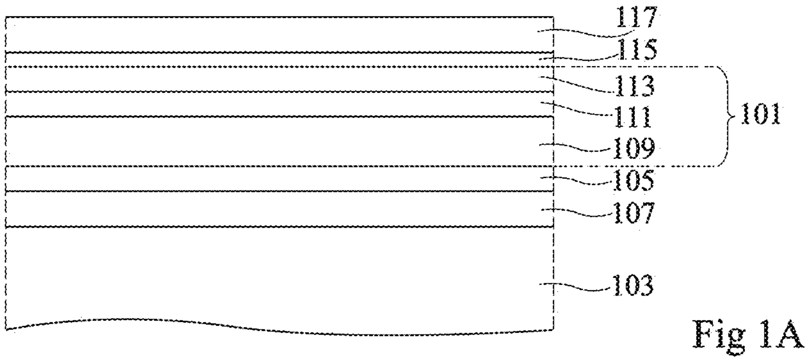
FIG. 1A, FIG. 1B, FIG. 1C, FIG. 1D, and FIG. 1E are schematic, partial cross-sectional views illustrating successive steps in an example method for manufacturing an electronic device according to one embodiment.

FIG. 1A illustrates more particularly a step of forming a structure comprising a diode stack 101, for example an inorganic light-emitting diode (LED) stack, disposed on a substrate 103, and a sacrificial layer 105 of semiconductor material interposed between the substrate 103 and the diode stack 101.

The substrate 103 is, for example, a wafer or piece of wafer made of a semiconductor material such as silicon, sapphire, gallium nitride or any other material on which a diode stack can be formed. As an example, substrate 103 is a free-standing gallium nitride substrate. In the example method described in relation to FIGS. 1A to 1E, the substrate 103 is a temporary support substrate intended to be removed, or disposed of, during manufacturing of the device.

In the example shown, the substrate 103 is coated, on one of its sides facing the diode stack 101 (the top side of the substrate 103, in the orientation of FIG. 1A), with a buffer layer 107. The buffer layer 107 is intended, for example, to form an interface between the substrate 103 and the diode stack 101, for example in order to improve the crystalline quality of the materials in the diode stack 101. By way of example, buffer layer 107 is formed by epitaxial growth from the top face of substrate 103.

In the illustrated example, one side of the buffer layer 107 opposite the substrate 103 (the top side of the buffer layer 107, in the orientation of FIG. 1A) is coated with the sacrificial layer 105. The sacrificial layer 105 is made, for example, of an inorganic semiconductor material, e.g. a III-V compound comprising at least a first Group III element, a second Group V element and, optionally, a third element, e.g. a Group III element other than the first element. By way of example, the material of sacrificial layer 105 is selected from gallium nitride (GaN), indium nitride (InN), indium-gallium nitride (InGaN), aluminum nitride (AlN), aluminum-gallium nitride (AlGaN), and indium-gallium-aluminum nitride (InGaAlN).

The buffer layer 107 is made of the same material as the sacrificial layer 105, for example gallium nitride.

The sacrificial layer 105, for example, is heavily doped with a first conductivity type, e.g. N-type ($N^{++}$ doping), and has for example a doping level of between $1\times10^{19}$ and $1\times10^{20}$ at./cm$^3$, e.g. in the case of silicon-based doping, and up to around $1\times10^{22}$ at./cm$^3$, e.g. in the case of germanium-based doping. By way of example, the sacrificial layer 105 is formed by epitaxial growth from the side of the buffer layer 107 opposite substrate 103 (the top side of the buffer layer 107, in the orientation shown in FIG. 1A).

Although a single buffer layer 107 located between the substrate 103 and the sacrificial layer 105 has been illustrated in FIG. 1A, the structure may alternatively comprise a stack of at least two buffer layers interposed between the substrate 103 and the sacrificial layer 105, the respective thicknesses and materials of these buffer layers being selected, for example, as a function of the material(s) present in the diode stack 101.

The diode stack 101 coats a side of the sacrificial layer 105 opposite the substrate 103 (the top side of the sacrificial layer 105, in the orientation of FIG. 1A). In the example shown, the diode stack 101 comprises a layer 109 doped with the first conductivity type (N-type, in this example) coating the top face of the sacrificial layer 105, an active layer 111 coating the top face of the layer 109, and a layer 113 doped with a second conductivity type (P-type, in this example), opposite the first conductivity type, coating the top face of the active layer 111. The layer 109 of the diode stack 101, for example, has a doping level strictly lower, e.g. at least ten times lower, preferably at least a thousand times lower, than that of the sacrificial layer 105. As an example, the layer 109 has a doping level of the order of $1\times10^{18}$ at./cm$^3$. As an example, the layers 109 and 113 are made of the same material as the sacrificial layer 105, e.g. gallium nitride.

In the example shown in FIG. 1A, where the diode stack 101 is an LED-type stack, the layers 109 and 113 are, for example, an electron injection and/or transport layer and a hole injection and/or transport layer respectively. The active layer 111 is, in this example, an emissive layer intended to emit light towards an external medium when a potential difference is applied between the layers 109 and 113 disposed on either side of the active layer 111. Although not detailed in FIG. 1A, the diode stack 101 may further comprise one or more hole-blocking layers, for example interposed between the emissive layer 111 and the electron injection and/or transport layer 109, and/or one or more electron-blocking layers, for example interposed between the emissive layer 111 and the hole injection and/or transport layer 113.

As an example, the active layer 111 comprises multiple quantum wells (MQWs).

In the illustrated example, an electrically conductive layer 115 coats a face of the diode stack 101 opposite the substrate 103 (the top face of the diode stack 101, in the orientation of FIG. 1A). In this example, the conductive layer 115 coats the top face of the layer 113. The conductive layer 115 is, for example, an anode electrode connected to the diode stack 101 through the hole injection and/or transport layer 113. By way of example, the conductive layer 115 is made of a metal or metal alloy.

In the example shown, a further electrically conductive layer 117 coats a side of the conductive layer 115 opposite the substrate 103 (the top side of the conductive layer 115, in the orientation of FIG. 1A). By way of example, the conductive layer 117 is made of a metal, such as titanium, or a metal alloy.

Figure 1B:
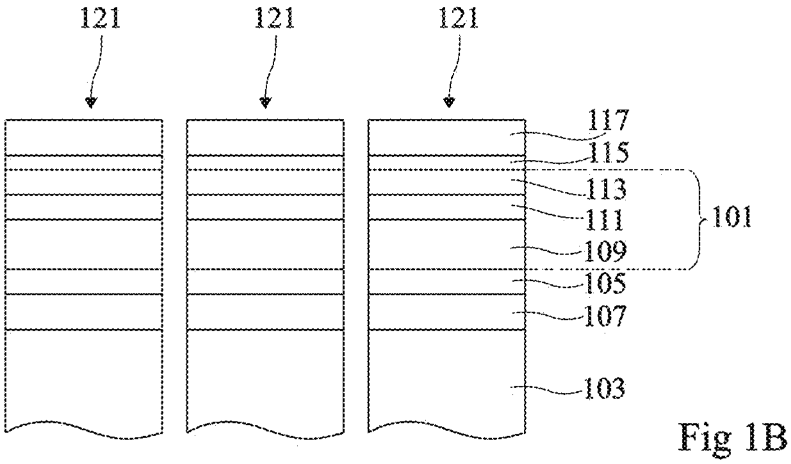

FIG. 1B more particularly illustrates a subsequent step of dicing the structure previously described in relation to FIG. 1A.

In the example shown, the structure shown in FIG. 1A is diced over its entire height to form vignettes 121. Each vignette 121 comprises a portion of the substrate 103 and a vertical stack comprising, in order from the substrate 103, portions of the buffer layer 107, the sacrificial layer 105, the diode stack 101, the conductive layer 115, and the conductive layer 117.

As an example, when viewed from above, each label 121 has a substantially rectangular, circular or square shape, and a surface area of between a few square micrometers and a few square centimeters.

Although three vignettes 121 have been shown in FIG. 1B, the dicing step can of course result in forming a number of vignettes 121 other than three, for example several tens or several hundreds of vignettes 121.

Figure 1C:
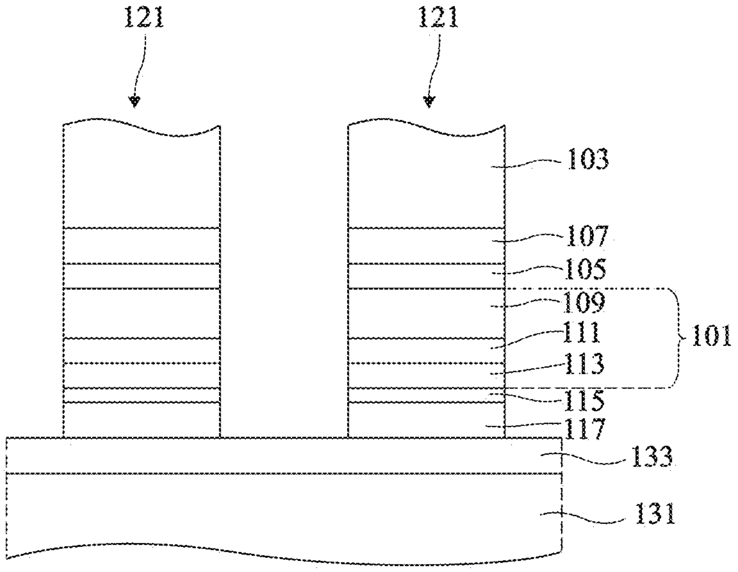

FIG. 1C more particularly illustrates a structure obtained after a subsequent step of transferring vignettes 121 (two vignettes 121, in the example shown) onto a substrate 131.

For example, the vignettes 121 are first turned over with respect to the orientation shown in FIG. 1B, and then brought into contact, by the side of the layer 117 opposite the substrate 103 (the lower side of the layer 117, in the orientation shown in FIG. 1C) with an electrically conductive layer 133 coating one side of the substrate 131 (the upper side of the substrate 131, in the orientation shown in FIG. 1C). In this step, the vignettes 121 are attached to the substrate 131. By way of example, attaching the vignettes 121 to the substrate 131 is achieved by molecular bonding between the two surfaces brought into contact. If the layers 117 and 133 are made of a conductive metal or metal alloy, the bonding is referred to as "metal-to-metal" or "conductive".

The substrate 131 is, for example, a wafer or piece of wafer made of a semiconductor material, such as silicon. Although not detailed in FIG. 1C, an electrically insulating layer, for example of silicon dioxide, can be provided between the substrate 131 and the conductive layer 133. By way of example, the conductive layer 133 is made of the same material as the layer 117, e.g. titanium.

Figure 1D:
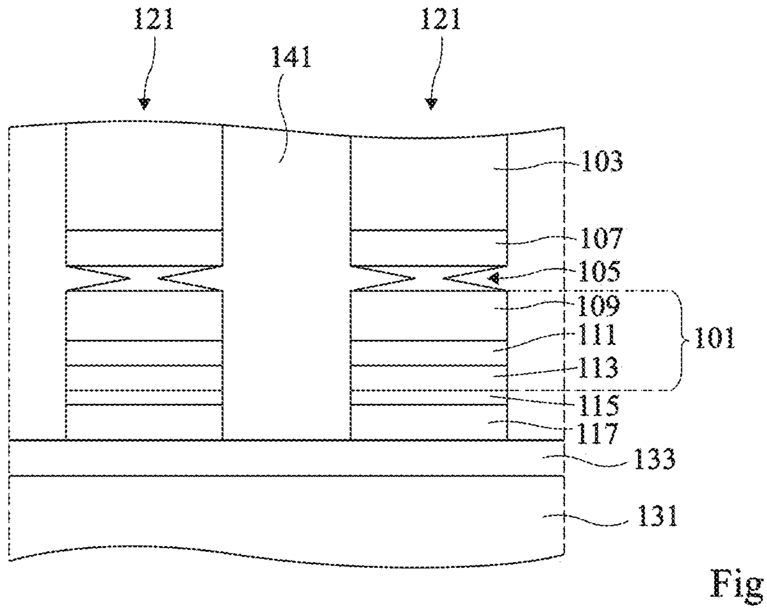

FIG. 1D more particularly illustrates a subsequent step for removing the sacrificial layer 105.

In the example shown, the sacrificial layer 105 is electropolished by applying a bias voltage via the diode stack 101. The structure previously described in relation to FIG. 1C is, for example, immersed in an electrolyte 141, and a bias or anodization voltage V_pol is, for example, applied, via a potentiostat, between a first electrode, e.g. an anode electrode connected to the conductive layer 133, and a second electrode, e.g. a platinum cathode electrode immersed in the electrolyte 141. In order not to overload the drawing, the potentiostat and the first and second electrodes for applying the bias voltage V_pol have not been shown in FIG. 1D. The voltage V_pol is, for example, substantially equal to the sum of a voltage V_LED, resulting from a voltage drop caused by the diode stack 101, and a voltage E applied to, or seen by, the sacrificial layer 105 (V_pol=E+V_LED). By way of example, for an anodizing current density equal to approximately 100 $\mu A/cm^2$, the voltage drop V_LED is equal to approximately 2 V, and the voltage E to which the layer 105 is subjected is equal to approximately 18 V, the anodizing voltage V_pol applied by the potentiostat then being equal to approximately 20 V.

As an example, the electrolyte 141 is an aqueous oxalic acid solution with a molar concentration of between 0.3 and 0.9 M.

In the example shown, electropolishing leads to porosification of the sacrificial layer 105. In the example shown in FIG. 1D, the material of the sacrificial layer portion 105 of each vignette 121 is progressively removed from its flanks towards a central region of the sacrificial layer portion 105. By way of example, the electropolishing speed of the sacrificial layer 105 is between 0.01 and 2 cm/h, for example between 1 and 2 cm/h.

In FIG. 1D, electropolishing is symbolized by the fact that the sacrificial layer 105 has V-shaped flanks. However, this example is not limitative, as the flanks of the sacrificial layer 105 may have any shape under the action of electropolishing, for example a substantially circular concave shape or a flat shape, corresponding for example to the shape of an electropolishing front moving laterally towards the center of the layer.

Figure 1E:
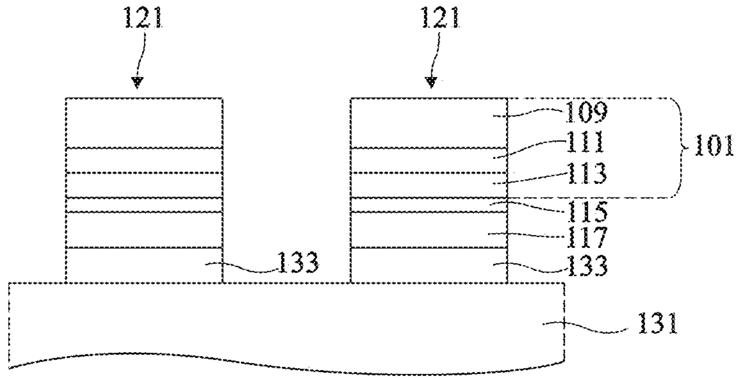

FIG. 1E more particularly illustrates a structure obtained at the end of subsequent steps of removing the substrate 103 and etching the layer 133.

For example, the substrate 103 and buffer layer 107 portions of each vignette 121 are removed, i.e. uncoupled from the diode stack 101, after the sacrificial layer 105 has been removed by electropolishing in the step described above in relation to FIG. 1D. In the example shown in FIG. 1E, the sacrificial layer 105 is completely removed.

An advantage of applying the voltage V_pol between an electrode connected to the layer 133 and another electrode immersed in the electrolyte 141 as described above in relation to FIG. 1D is that it enables precise control of the detachment zone of the substrate 103 and buffer layer 107 portions of each vignette 121 from the diode stack 101.

In the example shown, parts of the layer 133 between the vignettes 121 are removed, for example by photolithography followed by etching, while other portions of the layer 133 in line with the vignettes 121 are retained. This makes it possible, for example, to electrically isolate each vignette 121 from the other vignettes 121.

Subsequent steps in the method for manufacturing an electronic device can then be implemented starting from the structure illustrated in FIG. 1E, with the substrate 131, for example, being intended to be retained at the end of these steps.

Figure 2A:
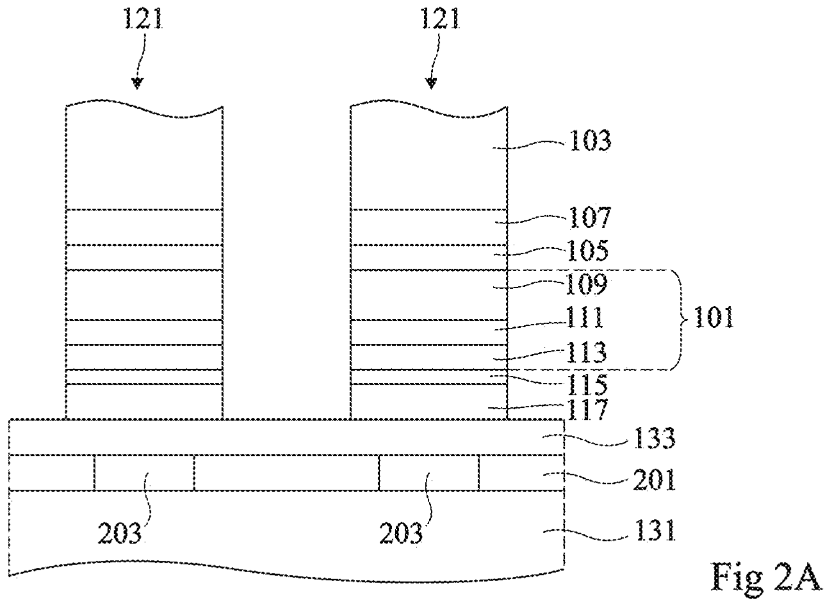
FIG. 2A and FIG. 2B are schematic, partial cross-sectional views illustrating successive steps of a variant of the method shown in FIGS. 1A to 1E.
Figure 2B:
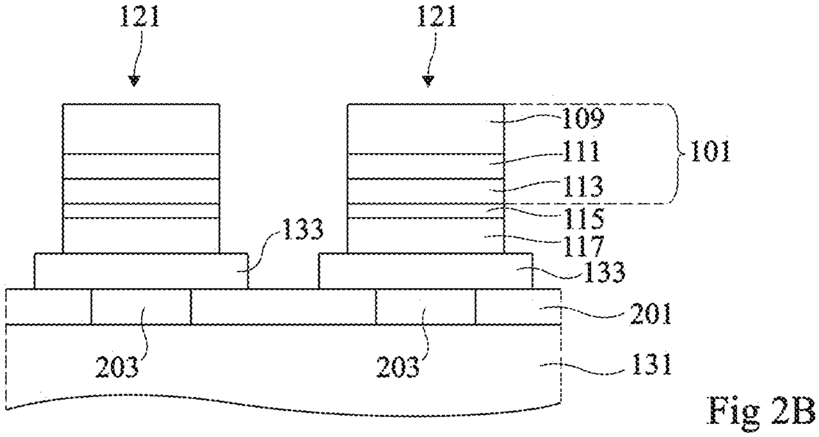

FIG. 2A and FIG. 2B are schematic, partial cross-sectional views illustrating successive steps in a variant of the method shown in FIGS. 1A to 1E.

FIG. 2A more particularly illustrates a structure obtained at the end of a step of transferring the vignettes 121 onto the substrate 131, similar to the step previously described in relation to FIG. 1C.

The step illustrated in FIG. 2A differs from the step illustrated in FIG. 1C in that, in the step illustrated in FIG. 2A, an electrically insulating layer 201, for example of silicon dioxide, is interposed between the substrate 131 and the electrically conductive layer 133. In the example shown, contact pick-up elements 203, for example electrically conductive pads, are formed in the insulating layer 201 and are flush with the face of the insulating layer 201 coated with the layer 133 (the top side of the insulating layer 201, in the orientation of FIG. 2A). By way of example, the insulating layer 201 and contact pick-up elements 203 form part of an interconnect stack not detailed in FIG. 2A. The contact pick-up elements 203 are intended, for example, to connect each vignette 121 to a control circuit (not shown) formed in and on the substrate 131.

By way of example, the substrate 131 is said to be "active", i.e. the substrate 131 comprises active electronic components such as transistors. The substrate 131 is, for example, of the CMOS (Complementary Metal-Oxide-Semiconductor) or TFT (Thin-Film Transistor) type.

FIG. 2B more particularly illustrates a structure obtained at the end of subsequent steps of removing the substrate 103 and of etching portions of the layer 133 located between the vignettes 121 analogous to the steps previously described in relation to FIG. 1E.

The sacrificial layer 105 is removed by electropolishing, for example under conditions similar to those previously described in relation to FIG. 1D, so as to remove, or eliminate, the buffer layer 107 and the substrate 103. By way of example, the portions of the layer 133 extending laterally between the vignettes 121 are then removed by photolithography followed by etching.

In the example shown, each vignette 121 is located vertically in line with a contact pick-up element 203 different from the contact pick-up elements 203 vertically in line with which the other vignettes 121 are located. Each contact pick-up element 203 can be used, for example, to control the diode stack 101 of the overlying vignette 121 independently of the diode stacks 101 of the other vignettes 121 of the electronic device.

Subsequent steps in the method for manufacturing an electronic device can then be implemented starting from the structure illustrated in FIG. 2B, with the substrate 131, for example, being intended to be retained at the end of these steps.

FIG. 3A, FIG. 3B, FIG. 3C, FIG. 3D, and FIG. 3E are schematic, partial cross-sectional views illustrating successive steps in an example of a method for manufacturing an electronic device according to one embodiment.

Figure 3A:
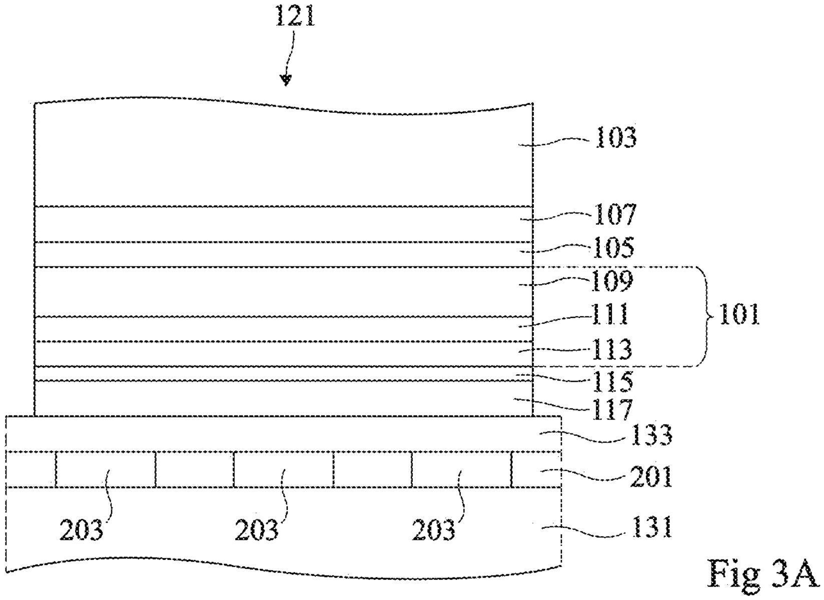
FIG. 3A, FIG. 3B, FIG. 3C, FIG. 3D, and FIG. 3E are schematic partial cross-sectional views illustrating successive steps in an example method for manufacturing an electronic device according to one embodiment.

FIG. 3A more particularly illustrates a structure obtained at the end of a step of transferring the vignettes 121 onto the substrate 131, similar to the step previously described in relation to FIG. 2A. Although transferring a single vignette 121 has been illustrated in FIG. 3A, several vignettes 121 can be transferred during this step.

The step illustrated in FIG. 3A differs from the step illustrated in FIG. 2A in that, in the step illustrated in FIG. 3A, each vignette 121 is transferred vertically in line with several contact pick-up elements 203 (three contact pick-up elements 203, in the example shown).

Figure 3B:
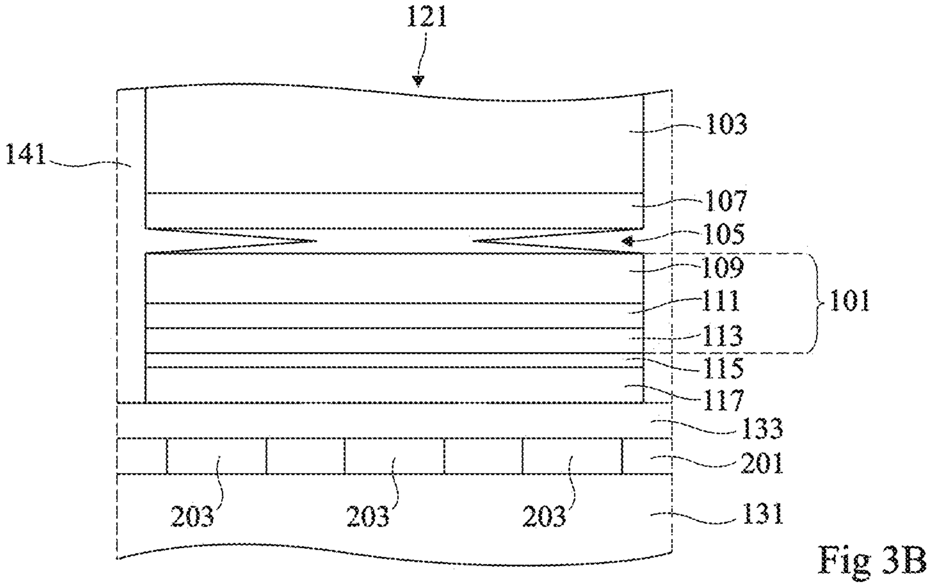

FIG. 3B more particularly illustrates a subsequent step of electropolishing the sacrificial layer 105 analogous to the step previously described in relation to FIG. 1D.

Figure 3C:
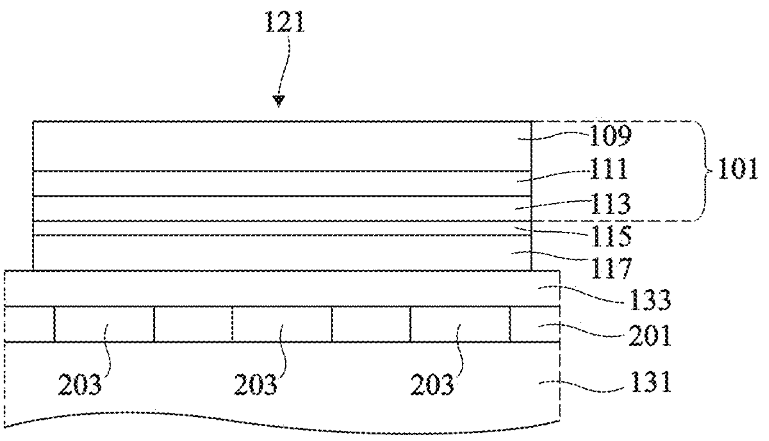

FIG. 3C more particularly illustrates a structure obtained at the end of a subsequent step of removing the substrate 103 and the buffer layer 107.

Figure 3D:
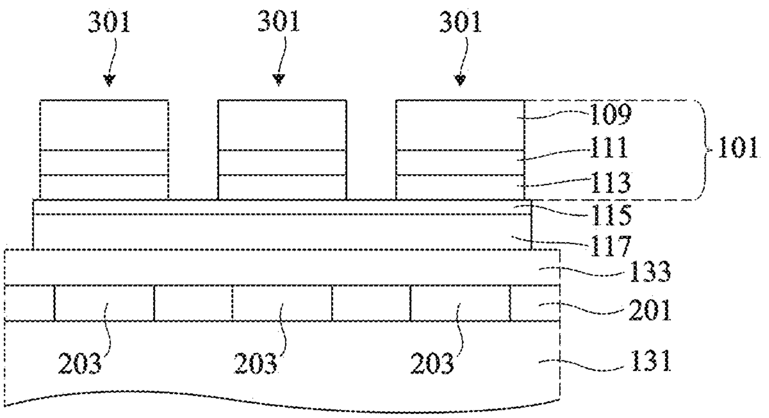

FIG. 3D more particularly illustrates a structure obtained at the end of a subsequent step of etching the diode stack 101 to form elementary diodes 301.

In the example shown, each elementary diode 301 is located vertically in line with a contact pick-up element 203, distinct from the contact pick-up elements 203 vertically in line with which the other elementary diodes 301 are located. In this example, the elementary diode 301 have smaller lateral dimensions than the vignettes 121.

Figure 3E:
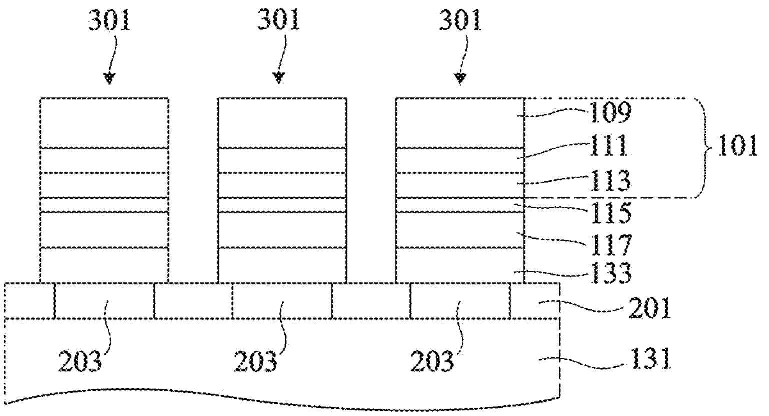

FIG. 3E more particularly illustrates a structure obtained at the end of a subsequent step of etching the conductive layers 115, 117, and 133.

In the example shown, portions of the conductive layers 115, 117, and 133 located between the elementary diodes 301 are removed, for example by photolithography and then etching, while other portions of the layers 115, 117, and 133 located vertically in line with the elementary diodes 301 are retained. This allows, for example, each elementary diode 301 to be electrically isolated from the other elementary diodes 301.

Subsequent steps in the method for manufacturing an electronic device can then be implemented starting from the structure illustrated in FIG. 3E, with the substrate 131, for example, being retained at the end of these steps.

Figure 4A:
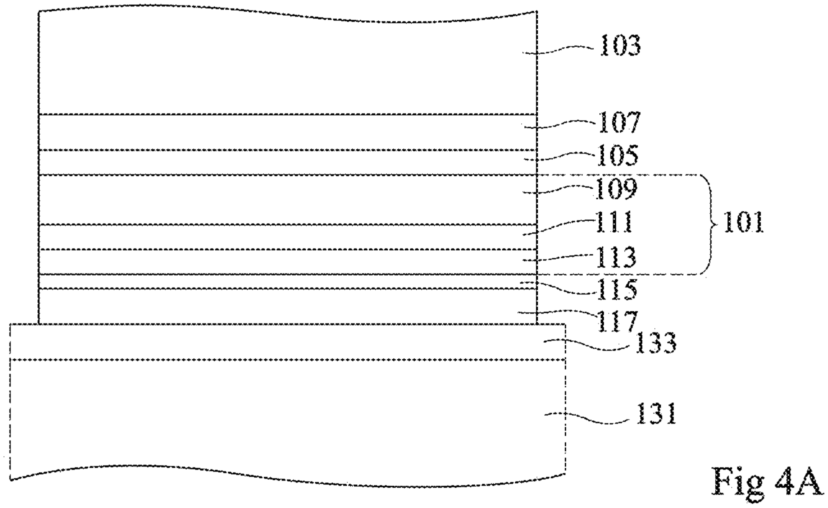
FIG. 4A, FIG. 4B, and FIG. 4C are schematic, partial cross-sectional views illustrating successive steps in an example method for manufacturing an electronic device according to one embodiment.
Figure 4B:
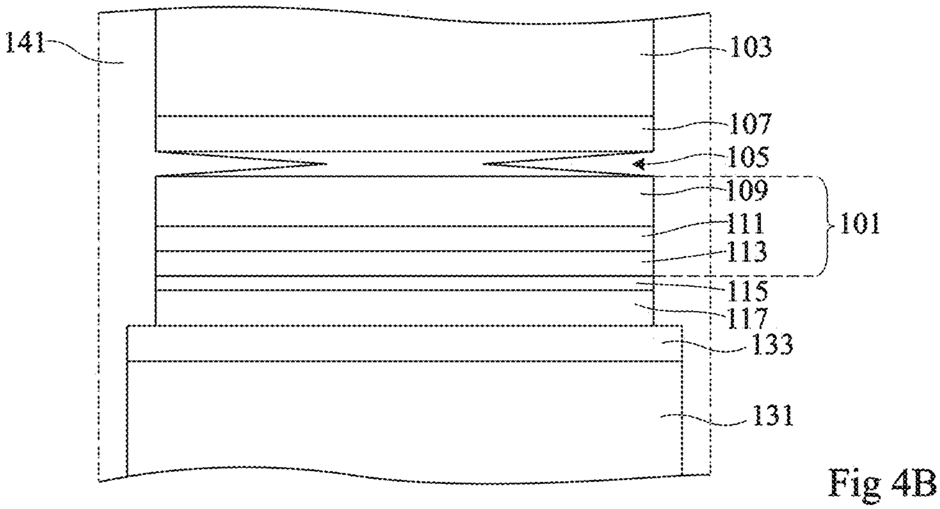
Figure 4C:
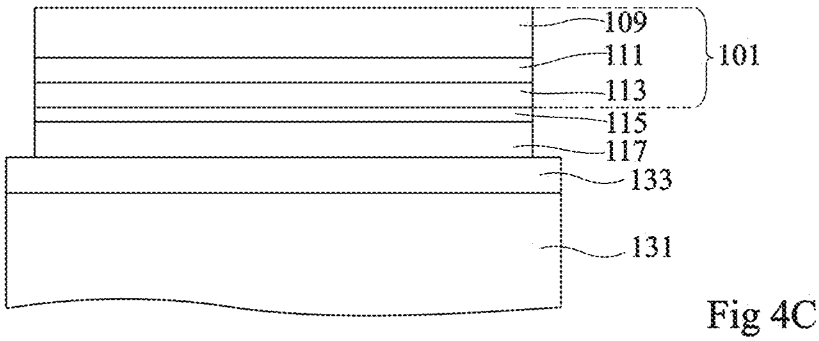

FIG. 4A, FIG. 4B, and FIG. 4C are schematic, partial cross-sectional views illustrating successive steps in an example method for manufacturing an electronic device according to one embodiment.

FIG. 4A more particularly illustrates a structure obtained at the end of a step of transferring the structure previously described in relation to FIG. 1A onto the substrate 131.

In the example shown, the structure shown in FIG. 1A is not diced before being transferred to the substrate 131. This corresponds, for example, to a case in which the substrate 103 is an entire wafer on which the diode stack 101 is formed. In this example, the substrate 103 has a maximum lateral dimension strictly smaller than that of substrate 131. By way of example, in the case where the substrates 103 and 131 have, in top view, a substantially circular-shaped periphery, the substrate 103 has a diameter strictly smaller than that of the substrate 131.

FIG. 4B more particularly illustrates a subsequent step of electropolishing the sacrificial layer 105 analogous to the step previously described in relation to FIG. 1D.

FIG. 4C more particularly illustrates a structure obtained at the end of a subsequent step of removing the substrate 103 and the buffer layer 107.

Subsequent steps in the method for manufacturing the electronic device can then be implemented starting from the structure illustrated in FIG. 4C, with the substrate 131, for example, being intended to be retained at the end of these steps.

Figure 5:
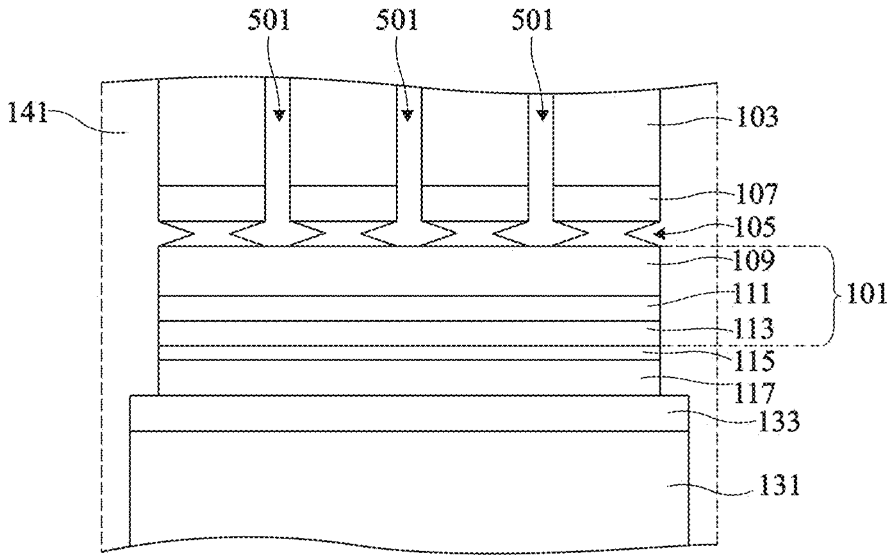
FIG. 5 is a partial schematic cross-sectional view illustrating a step in a variant of the method shown in FIGS. 4A to 4C.

FIG. 5 is a partial schematic cross-sectional view illustrating a step in a variant of the method shown in FIGS. 4A to 4C.

FIG. 5 more particularly illustrates a subsequent step of electropolishing the sacrificial layer 105 analogous to the step previously described in relation to FIG. 4B.

The step illustrated in FIG. 5 differs from the step illustrated in FIG. 4B in that, in the step illustrated in FIG. 5, hollow holes or vias 501 extend from a face of the substrate 103 opposite the diode stack 101 (the top face of the substrate 103, in the orientation of FIG. 5) to a face of the diode stack 101 facing the substrate 103 (the top face of the diode stack 101, in the orientation of FIG. 5). In the example shown, the vias 501 pass completely through the substrate 103, the buffer layer 107 and the sacrificial layer 105, and open onto a face of the electron injection and/or transport layer 109 facing the substrate 103 (the top side of layer 109, in the orientation shown in FIG. 5).

Although only three vias 501 have been shown in FIG. 5, a number of vias 501 greater than three may be provided. Alternatively, the vias 501 can be replaced by trenches extending, in the orientation shown in FIG. 5, from the top surface of the substrate 103 to the top surface of the electron injection and/or transport layer 109.

Providing the vias 501 passing through the sacrificial layer 105 advantageously allows a larger contact surface between the sacrificial layer 105 and the electrolyte 141 to be obtained. This results in a reduction in the duration of the electropolishing step compared with the step previously described in relation to FIG. 4B.

Figure 6:
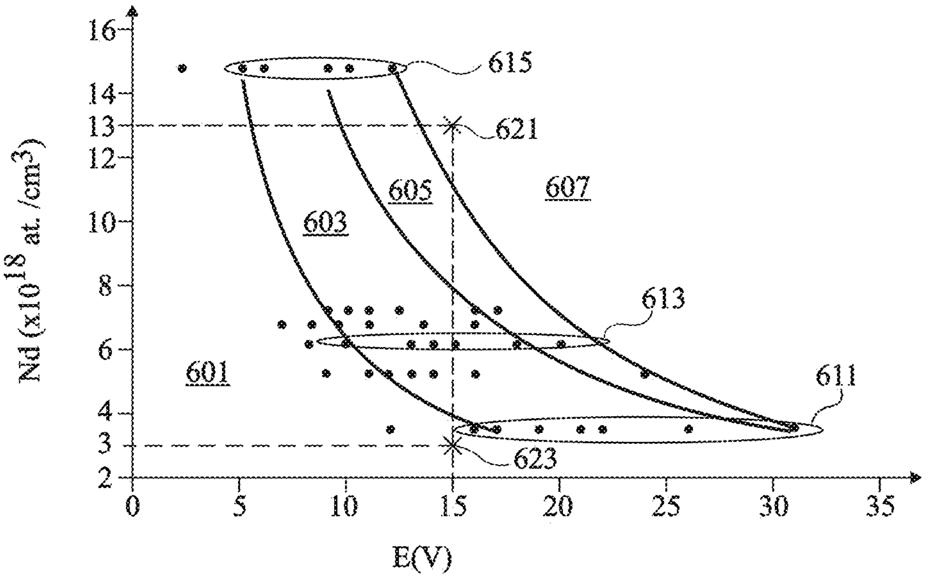
FIG. 6 is a graph showing variations in pore size and density within a gallium nitride layer as a function of doping level and bias voltage applied to said layer.

FIG. 6 is a graph showing variations in pore size and density within a gallium nitride layer, corresponding, for example, to the sacrificial layer 105, as a function of an Nd doping level (expressed in at./$cm^3$, ordinate values to be multiplied by $10^{18}$), and of a bias voltage E (in volts, V) applied to said layer.

In the example shown, the graph comprises:

a prebreakdown region 601, in which the crystalline structure of the layer begins to degrade;

a porosification region 603, in which pores form inside the layer, but these pores however do not significantly reduce the mechanical cohesion of the layer;

an electropolishing limit region 605, in which the mechanical cohesion of the layer begins to deteriorate; and an electropolishing region 607, in which the layer is removed under the application of the bias voltage.

Furthermore, the graph of FIG. 6 comprises:

a zone 611 corresponding to an Nd doping level equal to approximately $3.5\times10^{18}$ at./$cm^3$, in which the pores have a size between 25 and 52 nm, and a density between $0.12\times10^{10}$ and $2.4\times10^{10}$ $cm^{-2}$;

a zone 613 corresponding to an Nd doping level equal to approximately $6\times10^{18}$ at./$cm^3$, in which the pores have a size of between 24 and 39.7 nm and a density of between $3\times10^{10}$ and $4.9\times10^{10}$ $cm^{-2}$; and a zone 615 corresponding to an Nd doping level equal to approximately $15\times10^{18}$ at./$cm^3$, in which the pores have a size of between 17 and 31 nm and a density of between $5.7\times10^{10}$ and $10.6\times10^{10}$ $cm^{-2}$.

The size of a pore, for example, corresponds to its maximum lateral dimension.

In the case where the sacrificial layer 105 is made of gallium nitride, an Nd doping level of the order of $13\times10^{18}$ at./$cm^3$ and a voltage E applied to the layer 105 of the order of 15 V, symbolized by a cross 621 located in the electropolishing region 607, allows, for example, the electropolishing steps of the sacrificial layer 105 previously described in relation to FIGS. 1D, 3B, 4B and 5 to be implemented. In this case, the layer 109 of the diode stack 101 has, for example, a doping level of the order of $3\times10^{18}$ at./$cm^3$, symbolized by a cross 623 located in the prebreakdown region 601. This enables the sacrificial layer 105 to be removed without damaging the layer 109 of the diode stack 101. By way of example, the bias voltage V_pol in this case is of the order of 17 V. Alternatively, the doping level of the layer 109 can be such that the cross 623 is located in the porosification region 603, or even in the electropolishing limit region 605, for example less than or equal to $10\times10^{18}$ at./$cm^3$.

Various embodiments and variants have been described. Those skilled in the art will understand that certain features of these embodiments can be combined and other variants will readily occur to those skilled in the art. In particular, those skilled in the art will be able to combine the variant of FIGS. 2A and 2B with the embodiment of FIGS. 4A to 4C and the variant of FIG. 5, i.e. to provide, in the embodiment of FIGS. 4A to 4C and in the variant of FIG. 5, an active substrate 131 overlaid with an insulating layer in which contact pick-up elements are formed.

Furthermore, those skilled in the art is able to combine the embodiment described above in relation to FIGS. 3A to 3E with the embodiment and variant described in relation to FIGS. 4A to 5. To this end, those skilled in the art may in particular provide, in the step described in relation to FIG. 3A, transferring onto the substrate 131 not one or more vignettes 121, but the structure described in relation to FIG. 1A.

Those skilled in the art is also able to adapt the variant shown in relation to FIG. 5 to the embodiments and variants described in relation to FIGS. 1A to 3E, i.e. to provide vias or trenches to increase the contact surface of the sacrificial layer 105 with the electrolyte 141 during the step of electropolishing the sacrificial layer 105.

Although the embodiments described above take as an example the case where the diode stack 101 is of the LED type, these embodiments are transposable by those skilled in the art to cases where the diode stack 101 is of any type, for example a power diode stack, a photosensitive diode stack, etc. More generally, the embodiments described apply to any type of stack comprising at least one PN junction.

Finally, the practical implementation of the embodiments and variants described herein is within the capabilities of those skilled in the art based on the functional description provided hereinabove. In particular, the described embodiments are not limited to the particular examples of materials and dimensions mentioned above.

Furthermore, the person skilled in the art is able to choose the material and the Nd doping level of the sacrificial region 105 from the indications of the present description. Those skilled in the art is also able to select the bias voltage V_pol to be applied during the step of electropolishing the sacrificial layer 105, for example as a function of the voltage E to be applied to the layer 105.

The invention claimed is:

1. A method of manufacturing an electronic device comprising the following successive steps:

a) forming a structure comprising a diode stack disposed on a first substrate, and a sacrificial layer of semiconductor material interposed between the first substrate and the diode stack;

b) transferring the structure to a second substrate; and c) removing the first substrate by electropolishing the sacrificial layer by applying a bias voltage to the sacrificial layer via the diode stack.

2. The method according to claim 1, wherein, in step b), transferring is performed by conductive molecular bonding on the side of a first face of the diode stack opposite the first substrate.

3. The method according to claim 1, wherein, in step c), the structure is immersed in an electrolyte.

4. The method according to claim 3, wherein, in step c), the bias voltage is applied between a first electrode connected to a conductive layer disposed on the second substrate, and a second electrode immersed in the electrolyte.

5. The method according to claim 4, wherein the conductive layer coats the second substrate.

6. The method according to claim 4, wherein an insulating layer in which contact pick-up elements are formed, is interposed between the second substrate and the conductive layer.

7. The method according to claim 6, further comprising, subsequent to step c), a step of etching the diode stack so that an elementary diode is formed vertically in line with each contact pick-up element.

8. The method according to claim 1, wherein, in step a), the first substrate is a full wafer with a maximum lateral dimension strictly smaller than that of the second substrate.

9. The method according to claim 1, further comprising, between steps b) and c), a step of forming hollow vias extending from a face of the first substrate opposite the diode stack to the diode stack, and passing through the sacrificial layer.

10. The method according to claim 1, wherein the diode stack comprises:

a first layer doped with a first type of conductivity coating the sacrificial layer;

an active layer coating the first layer; and a second layer doped with a second type of conductivity, opposite the first type of conductivity, coating the active layer.

11. The method according to claim 10, wherein the sacrificial layer is doped with the first conductivity type.

12. The method according to claim 11, wherein the first layer has a doping level strictly lower than the sacrificial layer.

13. The method according to claim 12, wherein the first layer has a doping level at least ten times lower than the sacrificial layer.

14. The method according to claim 12, wherein the first layer has a doping level at least a thousand times lower than the sacrificial layer.

15. The method according to claim 1, wherein the sacrificial layer is made of an III-V semiconductor material.

16. The method according to claim 1, wherein the sacrificial layer is made of gallium nitride.

17. The method according to claim 1, wherein the diode stack is an inorganic light-emitting diode stack.

* * * * *